United States Patent
Agarwal et al.

(10) Patent No.: US 8,289,198 B2
(45) Date of Patent: Oct. 16, 2012

(54) LOW POWER BIT SWITCHES AND METHOD FOR HIGH-VOLTAGE INPUT SAR ADC

(75) Inventors: Vinay Agarwal, Tucson, AZ (US); Robert E. Seymour, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 87 days.

(21) Appl. No.: 12/925,916

(22) Filed: Nov. 2, 2010

(65) Prior Publication Data

US 2012/0105265 A1   May 3, 2012

(51) Int. Cl.
*H03M 1/34* (2006.01)
(52) U.S. Cl. .................. 341/172; 341/155; 341/163
(58) Field of Classification Search ............... 341/172
See application file for complete search history.

(56) References Cited

U.S. PATENT DOCUMENTS

| | | | | |
|---|---|---|---|---|
| 4,803,462 A * | 2/1989 | Hester et al. | ................. | 341/172 |
| 5,684,487 A * | 11/1997 | Timko | ............................ | 341/172 |
| 6,667,707 B2 | 12/2003 | Mueck et al. | ................. | 341/172 |
| 6,731,232 B1 | 5/2004 | Kearney | ......................... | 341/163 |
| 6,922,165 B2 | 7/2005 | Seymour | ........................ | 341/172 |
| 7,015,841 B2 * | 3/2006 | Yoshida et al. | ............... | 341/120 |

* cited by examiner

*Primary Examiner* — Khai M Nguyen
(74) *Attorney, Agent, or Firm* — John J. Patti; Wade J. Brady, III; Frederick J. Telecky, Jr.

(57) ABSTRACT

A switched capacitor circuit, which may be an SAR ADC, includes a plurality of bit switching circuits (33) each including a high-voltage sampling switch circuit (18) having a first terminal (28) coupled to a first terminal of a corresponding capacitor (22) and a second terminal coupled to receive an analog input signal ($V_{SIG}$). A third terminal of the sampling switch circuit is coupled to an intermediate conductor (19). Each switching circuit (33) also includes a low-voltage conversion switch circuit (30) coupled to the intermediate conductor (19) and a combinational logic circuit (12) applying low-voltage signals to the conversion switch circuit and a level-shifting circuit (16) that generates corresponding high-voltage signals (HV_SIG_DRV) which control coupling of the first terminal (28) to the analog input signal and the intermediate conductor.

20 Claims, 8 Drawing Sheets

LOW POWER BIT SWITCHES AND METHOD FOR HIGH-VOLTAGE INPUT SAR ADC

BACKGROUND OF THE INVENTION

The present invention relates generally to reducing power in integrated circuits that include high-voltage switches, and more particularly to reducing power consumed in bit sampling switches in high-voltage SAR ADCs (successive approximation register analog-to-digital converters).

For example, in conventional high-voltage 16-bit SAR ADCs, each bit switching circuit includes three high-voltage switches, one for sampling a high-voltage analog input signal $V_{SIG}$, one for switching the bottom plate of a corresponding CDAC (capacitor DAC) capacitor to a first reference voltage $V_{REF}$, and one for switching the plate of a corresponding CDAC capacitor to a second reference voltage GND. The high power consumption is due to the high dynamic power associated with the level-shifting of various digital control signals during each switching event. Furthermore, the bit switches typically are very large, in order to achieve the low channel resistances required for fast signal settling.

"Prior Art" FIG. 1A shows the basic part of a conventional 16-bit SAR ADC circuit, which is repeated for every capacitor of the CDAC array. The complete circuit includes 16 low-voltage (e.g., 5 volt) combinational logic circuits 12 which receive a sampling signal SMPL from a digital control circuit (e.g., circuit 21 in FIG. 2B), 16 signals BIT that are sequentially generated by SAR logic circuitry (e.g., SAR logic 27 in FIG. 2C) in response to the output of a SAR comparator 25, and 16 "trim" signals e.g., (BIT_SAMP in FIG. 2A) that determine which of 16 CDAC capacitors are to be utilized for sampling the analog input signal $V_{SIG}$. Each of the 16 combinational logic circuits 12 generates corresponding low-voltage drive signals SIG_DRV, REF_DRV, and GND_DRV which are applied to the inputs of three corresponding level shifter circuits, respectively, in each of 16 blocks 14 in order to generate the corresponding high corresponding voltage signals HV_SIG_DRV, HV_REF_DRV, and HV_GND_DRV, respectively.

Bit switching circuit 17 in each block 14 includes three high-voltage bit switching circuits, one for each bit of the SAR ADC. For convenience, each bit switching circuit is represented by a single pole, triple throw switch having its pole terminal coupled by conductor 28 to the bottom plate of a corresponding CDAC capacitor in a CDAC 20. Each single pole, triple throw switch has one pole connected to high-voltage analog input signal $V_{SIG}$, another pole connected to reference voltage $V_{REF}$, and a third pole connected to the ground voltage GND (or $V_{SS}$). The upper plate of each of the 16 CDAC capacitors in block 20 is connected by a conductor 24 to one input of a SAR comparator 25, the output of which is connected to an input of the above mentioned SAR logic (not shown). The three level shifter circuits in each block 14 are powered by relatively high supply voltages $HV_{DD}$ and $HV_{SS}$, which may be 15 volts and −15 volts, respectively. The foregoing conventional SAR ADC circuitry is included in the assignee's presently marketed ADS8556 product.

All of the $V_{SIG}$ sampling, $V_{REF}$ and GND switches are formed from high-voltage transistors because they share the same "pole node" with the high-voltage analog input signal $V_{SIG}$, and consequently the digital control signals SIG_DRV, REF_DRV, and GND_DRV must be level-shifted to a high voltage range. Unfortunately, the level shifters consume a great deal of power.

The problem of high power consumption in bit switches of conventional high-voltage SAR ADCs sometimes has been dealt with by using a resistive divider circuit to attenuate the high-voltage analog input signal $V_{SIG}$ before it is sampled onto a selected CDAC bit capacitor (or capacitors) will, to avoid the use of high-voltage switches for sampling the high-voltage analog input signal $V_{SIG}$ during sampling operation and switching between $V_{REF}$ and GND during successive approximation analog-to-digital conversion. This approach is shown in Prior Art FIG. 1B, which is the same as FIG. 1 of U.S. Pat. No. 6,731,232 entitled "Programmable Input Range in SAR ADC" issued May 4, 2004 to Kearney. The resistive divider results in an undesirably low impedance input, and also results in high power consumption in circuitry required for driving the resistive divider. Another technique for dealing with the high power consumption has been to use a capacitive divider circuit to attenuate the high-voltage input signal between the capacitors of a separate sampling CDAC in series with the conversion CDAC involved in the successive approximation operation. The capacitive divider referred to is shown in Prior Art FIG. 1C, which is the same as FIG. 6 in the above mentioned Kearney patent. In Prior Art FIG. 1C, the sampling switches used for sampling the high-voltage analog input signal onto the CDAC capacitors need to be high-voltage switches, but the $V_{REF}$ and GND switches used during the conversion operation can be low-voltage switches. However, this technique has the disadvantage of poor SNR (signal to noise ratio) due to the attenuation of the input signal caused by the additional sampling CDAC, as well as the disadvantage of requiring additional integrated circuit die area.

Thus, there is an unmet need for a high-voltage SAR ADC in which dynamic power consumption is substantially reduced compared to the dynamic power consumption in the closest prior art high-voltage SAR ADCs.

There also is an unmet need for a high-voltage SAR ADC having lower power consumption and requiring less integrated circuit chip area than the closest prior art high-voltage SAR ADCs.

There also is an unmet need for a high-voltage SAR ADC having reduced current spikes in the high-voltage supplies than is the case for the closest prior art high-voltage SAR ADCs.

There also is an unmet need for a high-voltage SAR ADC in which a high-voltage analog input signal can be coupled to the CDAC capacitors thereof with less signal distortion than in the closest prior art high-voltage SAR ADCs.

There also is an unmet need for a high-voltage SAR ADC having good signal-to-noise performance along with significantly lower dynamic power consumption compared to the closest prior art SAR ADCs.

SUMMARY OF THE INVENTION

It is an object of the invention to provide a high-voltage SAR ADC in which dynamic power consumption is substantially reduced compared to the dynamic power consumption in the closest prior art high-voltage SAR ADCs.

It is another object of the invention to provide a high-voltage SAR ADC having lower power consumption and requiring less integrated circuit chip area than the closest prior art high-voltage SAR ADCs.

It is another object of the invention to provide a high-voltage SAR ADC having reduced current spikes in the high-voltage supplies than is the case for the closest prior art high-voltage SAR ADCs.

It is another object of the invention to provide a high-voltage SAR ADC in which a high-voltage analog input signal can be coupled to the CDAC capacitors thereof with less signal distortion at lower power consumption levels than in the closest prior art high-voltage SAR ADCs.

It is another object of the invention to provide a high-voltage SAR ADC having good signal-to-noise performance along with significantly lower dynamic power consumption compared to the closest prior art SAR ADCs.

It is another object of the invention to provide a high-voltage SAR ADC in which gain error in the ADC transfer function is reduced without substantially increasing dynamic power consumption.

It is another object of the invention to provide a high-voltage SAR ADC in which the faster conversion cycle times are achieved.

Briefly described, and in accordance with one embodiment, the present invention provides a switched capacitor circuit, which may be a SAR ADC, that includes a plurality of bit switching circuits (33) each including a high-voltage sampling switch circuit (18) having a first terminal (28) coupled to a first terminal of a corresponding capacitor (22) and a second terminal coupled to receive an analog input signal ($V_{SIG}$). A third terminal of the sampling switch circuit is coupled to an intermediate conductor (19). Each switching circuit (33) also includes a low-voltage conversion switch circuit (30) coupled to the intermediate conductor (19) and a combinational logic circuit (12) applying low-voltage signals to the conversion switch circuit and a level-shifting circuit (16) that generates corresponding high-voltage signals (HV_SIG_DRV) which control coupling of the first terminal (28) to the analog input signal and the intermediate conductor.

In one embodiment, the invention provides a high-voltage switched capacitor circuit (10) including a plurality of capacitors (22) each having a first terminal, a plurality of bit switching circuits (33) each including a high-voltage sampling switch circuit (18) having a first terminal (28) coupled to a second terminal of a corresponding capacitor (22) and a second terminal coupled to receive a high-voltage analog input signal ($V_{SIG}$), and a third terminal coupled to an intermediate conductor (19). Each bit switching circuits (33) also includes a low-voltage conversion switch circuit (30) including a first terminal coupled to the intermediate conductor (19), a second terminal coupled to receive a first reference voltage ($V_{REF}$), and a third terminal coupled to receive a second reference voltage (GND). A plurality of low-voltage combinational logic circuits (12) generate a plurality of low-voltage first signals (SIG_DRV), respectively, in response to a sampling level of a mode control signal (SMPL). Each low-voltage combinational logic circuit (12) also generates low-voltage second (REF_DRV) and third (GND_DRV) signals according to a corresponding one of a plurality of bit signals (BIT<1:16>), respectively, during a predetermined level of the mode control signal (SMPL). A plurality of level-shifting circuits (16) each has an input coupled to receive a corresponding low-voltage first signal (SIG_DRV). Each level-shifting circuit (16) generates a corresponding high-voltage second signal (HV_SIG_DRV) to control coupling of the first terminal (28) of a corresponding high-voltage sampling switch circuit (18) to the high-voltage analog input signal ($V_{SIG}$) during the sampling level and to the intermediate conductor (19) during the pre-determined level.

In a described embodiment, the high-voltage switched capacitor circuit is a high-voltage SAR ADC, the capacitors are CDAC capacitors (22 or C1p, C2p . . . C16p) each having a first terminal coupled to a first input (−) of a comparator (25), and the predetermined level is a conversion level, wherein the high-voltage SAR ADC includes a SAR logic circuit (27) having an input coupled to an output of the comparator (25), and performs a successive approximation procedure in response to the output of the comparator (25) to successively generate the corresponding bit signals (BIT<1:16>) to provide a digital representation of the high-voltage analog input signal ($V_{SIG}$).

In a described embodiment, each level-shifting circuit (16) includes a low-voltage first latch circuit (16A) having an input coupled to a corresponding low-voltage first signal (SIG_DRV) and also includes a high-voltage second latch circuit (16B) having an input coupled to an output of the low-voltage first latch circuit (16A), wherein the high-voltage second latch circuit (16B) produces the high-voltage second signal (HV_SIG_DRV=HV_OUTp) and a high-voltage third signal (HV_OUTn) which is a logical complement of the high-voltage second signal (HV_SIG_DRV=HV_OUTp). The high-voltage second and third output signals are coupled to control a corresponding high-voltage sampling switch circuit (18).

In a described embodiment, each high-voltage sampling switch circuit (18) includes a high-voltage boosted switch circuit (18A in FIG. 5) including a boost transistor (54) and a boost capacitor (55) coupled between a gate and a first electrode of the boost transistor (54), wherein the first electrode of the boost transistor (54) is coupled to the second terminal ($V_{SIG}$) of that high-voltage sampling switch circuit (18) to receive the high-voltage analog input signal ($V_{SIG}$), and a second electrode of the boost transistor (54) is coupled to the first terminal (28) of that high-voltage sampling switch circuit (18).

In one embodiment, each high-voltage sampling switch circuit (18) also includes a high voltage transmission gate (18B) controlled by a corresponding level-shifting circuit (16) coupled in parallel with the high-voltage boosted switch circuit (18A) in that high-voltage sampling switch circuit (18). A precharging circuit (58) precharges the boost capacitor (55).

In one embodiment, the precharging circuitry (58) produces a boosted output voltage equal to a high-magnitude lower reference voltage level ($HV_{SS}$) plus a boost voltage (Vboost), wherein the boost transistor (54) is an N-channel transistor. The high-voltage boosted switch circuit (18A) includes a first N-channel transistor (60) having a drain coupled to receive the boosted output voltage ($HV_{SS}$+Vboost) and a source coupled to both a first terminal (61) of the boost capacitor (55) and a first terminal of a CMOS (complementary metal oxide semiconductor) transmission gate (64,65), a second N-channel transistor (63) having a source coupled to the high-magnitude lower voltage reference level ($HV_{SS}$) and a drain (62) coupled to a second terminal of the boost capacitor (55) and to a source of a third N-channel transistor (66) having a drain coupled to the high-voltage analog input signal ($V_{SIG}$) and a gate coupled to a second terminal of the CMOS transmission gate (64,65) and to a gate of the boost transistor (54), a fourth N-channel transistor (67) having a source coupled to the high-magnitude lower reference voltage level ($HV_{SS}$) and a drain coupled to the gate of the boost transistor (54). The gate of the first N-channel transistor (60), a gate of the second N-channel transistor (63), a gate of the fourth N-channel transistor (67), and a first control terminal of the CMOS transmission gate (64,65) are coupled to receive a logical complement of the high-voltage second signal (HV_SIG_DRV), and a second control terminal of the CMOS transmission gate (64,65) is coupled to receive the high-voltage second signal (HV_SIG_DRV).

In a described embodiment, a digital controller (21) generates the mode control signal (SMPL) and a plurality of ADC gain control signals (BIT_SAMP<1:16>) to determine which of the plurality of CDAC capacitors (C1p, C2p . . . C16p) are to be utilized for sampling of the analog input signal ($V_{SIG}$), wherein the plurality of low-voltage combinational logic circuits (12) generate the plurality of low-voltage first signals (SIG_DRV), respectively, according to predetermined levels of the ADC gain control signals (BIT_SAMP<1:16>).

In a described embodiment, the SAR ADC is a 16-bit SAR ADC, wherein the plurality of CDAC capacitors includes 16 CDAC capacitors (C1p, C2p . . . C16p) in a first CDAC (10p), the first CDAC (10p) including 16 of the bit switching circuits (33), 16 of the low-voltage combinational logic circuits (12), and 16 of the level shifting circuits (16). In one embodiment, the high-voltage SAR ADC also includes a second CDAC (10n) that is essentially similar to the first CDAC (10p), wherein the CDAC capacitors in the second CDAC (10n) each have a first terminal coupled to a second input (+) of the comparator (25).

In one embodiment, each low-voltage combinational logic circuit (12) includes a first inverter (40) having an input coupled to receive a corresponding bit signal (BIT<1:16>) and an output coupled to a first input of a first ORing circuit (41). The second inverter (43) has an input coupled to an output of the first ORing circuit (41) and an output coupled to a first input of a second ORing circuit (44), a third inverter (45) has an input coupled to the output of the first ORing circuit (41) and an output coupled to a first input of a third ORing circuit (46), and an ANDing circuit (42) has an output coupled to a second input of the second ORing circuit (44) and to a second input of the third ORing circuit (46). The mode control signal (SMPL) signal is applied to a second input of the first ORing circuit (41) and a first input of the ANDing circuit (42). A corresponding ADC gain control signal (BIT_SAMP<1:16>) is coupled to a second input of the ANDing circuit (42). The low-voltage first (SIG_DRV), second (REF_DRV), and third (GND_DRV) signals are produced at the outputs of the ANDing circuit (42), the third ORing circuit (46), and the second ORing circuit (44), respectively.

In one embodiment, a hold switch (38) is coupled between the second reference voltage (GND) and the first (−) input of the comparator (25), and the hold switch (30) is controlled in response to a hold signal (HOLD_CTRL) signal generated by the digital controller (21).

In one embodiment, each low-voltage combinational logic circuit (12) operates to cause a corresponding low-voltage conversion switch circuit (30) to couple a corresponding intermediate conductor (19) to one of the second ($V_{REF}$) and third (GND) terminals of that corresponding low-voltage sampling switch circuit (30) during the sampling level of the mode control signal (SMPL) to protect the low-voltage conversion switch circuit (30) from high voltages on the corresponding intermediate conductor (19).

In one embodiment, the invention provides a method for providing reduced power consumption in a high-voltage SAR ADC including a plurality of CDAC capacitors (22 or C1p, C2p . . . C16p) each having a first terminal coupled to a first input (−) of a comparator (25), a plurality of bit switching circuits (33) each including a high-voltage sampling switch circuit (18) having a first terminal (28) coupled to a second terminal of a corresponding CDAC capacitor (22) and a second terminal coupled to receive a high-voltage analog input signal ($V_{SIG}$), a plurality of low-voltage combinational logic circuits (12) for generating a plurality of low-voltage first signals (SIG_DRV), respectively, in response to a sampling level of a mode control signal (SMPL), each low-voltage combinational logic circuit (12) also generating corresponding low-voltage second (REF_DRV) and third (GND_DRV) signals according to a corresponding bit signal (BIT<1:16>) during a conversion level of the mode control signal (SMPL), and a plurality of level-shifting circuits (16) each having an input coupled to receive a corresponding low-voltage first signal (SIG_DRV), each level-shifting circuit (16) generating a corresponding high-voltage first signal (HV_SIG_DRV) to control coupling of the first terminal (28) of a corresponding high-voltage sampling switch circuit (18) to the second terminal ($V_{SIG}$) during the sampling level. The method includes
providing a low-voltage conversion switch circuit (30) and an intermediate conductor (19) in each bit switching circuit (33), wherein a first terminal of the low-voltage conversion switch circuit (30) is connected to the intermediate conductor (19);
coupling the first terminal (28) of one of the high-voltage sampling switch circuits (18) to the second terminal ($V_{SIG}$) of that high-voltage sampling circuit (18) in response to the corresponding high voltage second signal (HV_SIG_DRV) during the sampling level; and
coupling a third terminal of that high-voltage sampling switch circuit (18) to the intermediate conductor (19) in that bit switching circuit (33) during the conversion level, and, during the conversion level, coupling a second terminal of that low-voltage conversion switch circuit (30) to receive a first reference voltage ($V_{REF}$) in response to the corresponding low-voltage second signal (REF_DRV) if the corresponding bit signal (BIT<1:16>) is at a first level, and coupling a third terminal of that low-voltage conversion switch circuit (30) to receive a second reference voltage (GND) in response to the corresponding low-voltage third signal (GND_DRV) if the corresponding bit signal (BIT<1:16>) is at a second level.

In one embodiment, the method includes operating a SAR logic circuit (27) having an input coupled to an output of the comparator (25) to perform a successive approximation procedure in response to the output of the comparator (25) to successively generate the corresponding bit signals (BIT<1:16>) to provide a digital representation of the high-voltage analog input signal ($V_{SIG}$).

In one embodiment, the method includes operating each low-voltage combinational logic circuit (12) to cause a corresponding low-voltage conversion switch circuit (30) to couple a corresponding intermediate conductor (19) to one of the second ($V_{REF}$) and third (GND) terminals of that corresponding low-voltage sampling switch circuit (30) during the sampling level of the mode control signal (SMPL) to protect the low-voltage conversion switch circuit (30) from high voltages on the corresponding intermediate conductor (19).

In one embodiment, the method includes operating each low-voltage combinational logic circuit (12) to cause the corresponding low-voltage conversion switch circuit (30) to couple the corresponding intermediate conductor (19) to the third terminal (GND) of that corresponding low-voltage sampling switch circuit (30) during the sampling level of the mode control signal (SMPL).

In one embodiment, the method includes providing in each bit switching circuit (33) a high-voltage boosted switch circuit (18A in FIG. 5) including a boost transistor (54) and a boost capacitor (55) coupled between a gate and a first electrode of the boost transistor (54) in each high-voltage sampling switch circuit (18), the first electrode of the boost transistor (54) being coupled to the second terminal ($V_{SIG}$) of that high-voltage sampling switch circuit (18) to receive the high-voltage analog input signal ($V_{SIG}$), a second electrode of the boost transistor (54) being coupled to the first terminal (28) of that high-voltage sampling switch circuit (18), the method including precharging the boost capacitor (55) to produce a low impedance of the boost transistor (54).

In one embodiment, the invention provides a high-voltage SAR ADC including a plurality of CDAC capacitors (22 or C1p, C2p ... C16p) each having a first terminal coupled to a first input (−) of a comparator (25); a plurality of bit switching circuits (33) each including a high-voltage sampling switch circuit (18) having a first terminal (28) coupled to a second terminal of a corresponding CDAC capacitor (22) and a second terminal coupled to receive a high-voltage analog input signal ($V_{SIG}$); a plurality of low-voltage combinational logic circuits (12) for generating a plurality of low-voltage first signals (SIG_DRV), respectively, in response to a sampling level of a mode control signal (SMPL), each low-voltage combinational logic circuit (12) also generating corresponding low-voltage second (REF_DRV) and third (GND_DRV) signals according to a corresponding bit signal (BIT<1:16>) during a conversion level of the mode control signal (SMPL); a plurality of level-shifting circuits (16) each having an input coupled to receive a corresponding low-voltage first signal (SIG_DRV), each level-shifting circuit (16) generating a corresponding high-voltage first signal (HV_SIG_DRV) to control coupling of the first terminal (28) of a corresponding high-voltage sampling switch circuit (18) to the second terminal ($V_{SIG}$) during the sampling level; a low-voltage conversion switch circuit (30) and an intermediate conductor (19) in each bit switching circuit (33), wherein a first terminal of the low-voltage conversion switch circuit (30) is connected to the intermediate conductor (19); means (12,16) for coupling the first terminal (28) of one of the high-voltage sampling switch circuits (18) to the second terminal ($V_{SIG}$) of that high-voltage sampling circuit (18) in response to the corresponding high voltage second signal (HV_SIG_DRV) during the sampling level; and means (12,16,) for coupling a third terminal of that high-voltage sampling switch circuit (18) to the intermediate conductor (19) in that bit switching circuit (33) during the conversion level, and, during the conversion level, coupling a second terminal of that low-voltage conversion switch circuit (30) to receive a first reference voltage ($V_{REF}$) in response to the corresponding low-voltage second signal (REF_DRV) if the corresponding bit signal (BIT<1:16>) is at a first level, and coupling a third terminal of that low-voltage conversion switch circuit (30) to receive a second reference voltage (GND) in response to the corresponding low-voltage third signal (GND_DRV) if the corresponding bit signal (BIT<1:16>) is at a second level.

DETAILED DESCRIPTION OF THE PREFERRED EMBODIMENTS

Figure 1A:
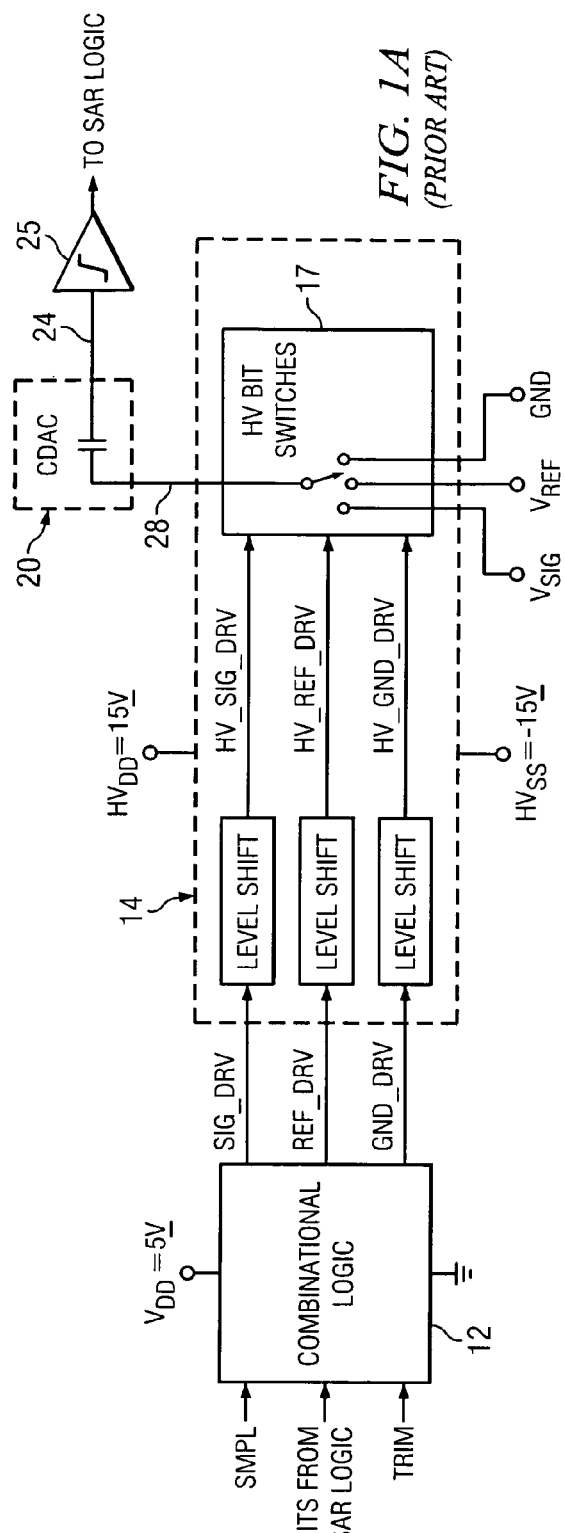
FIG. 1A is a schematic diagram illustrating conventional circuitry in a high-voltage SAR ADC.
Figure 1B:
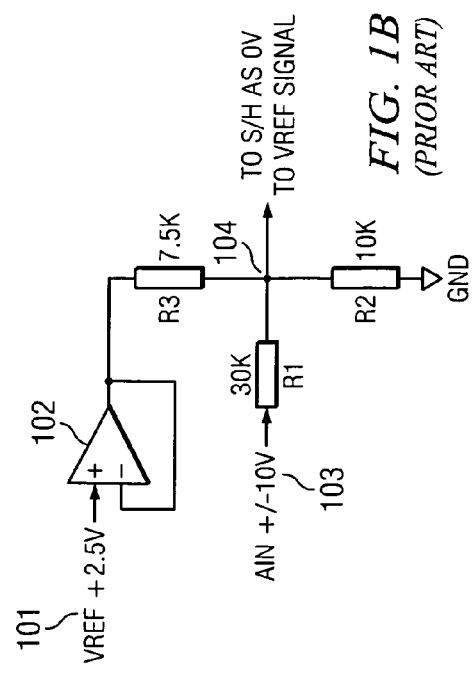
FIG. 1B is a schematic diagram illustrating one conventional technique using a resistive voltage divider to divide down an analog input to be used as an input to a SAR ADC.
Figure 1C:
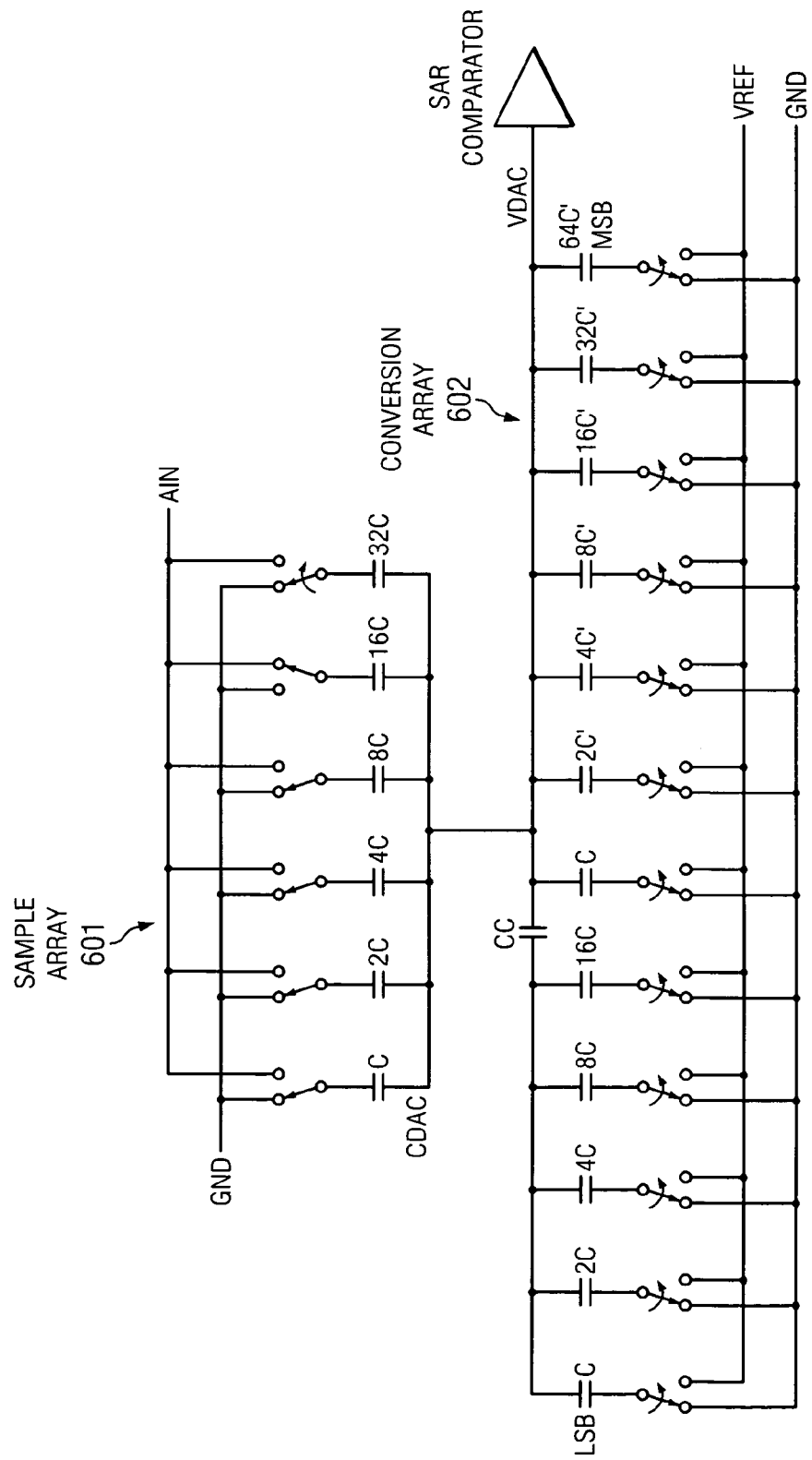
FIG. 1C is a schematic diagram illustrating another conventional technique using a capacitive voltage divider to divide down an analog input to be used as an input to a SAR ADC.

A detailed analysis of the power consumption of the 16-bit SAR ADC in Prior Art FIG. 1A was performed in an effort to substantially reduce the power consumption. The packet of charge consumed by each of the three level shifters every time it changes state results in a transient current peak in both the $HV_{DD}$ and $HV_{SS}$ high-voltage power supplies every time each level shifter changes state. It was determined that an excessively large amount of the total power consumption of the 16-bit SAR ADC is due to dynamic power consumed by the switching of the three level shifters to provide the three high-voltage switch control signals HV_SIG_DRV, HV_REF_DRV, and HV_GND_DRV.

Figure 2A:
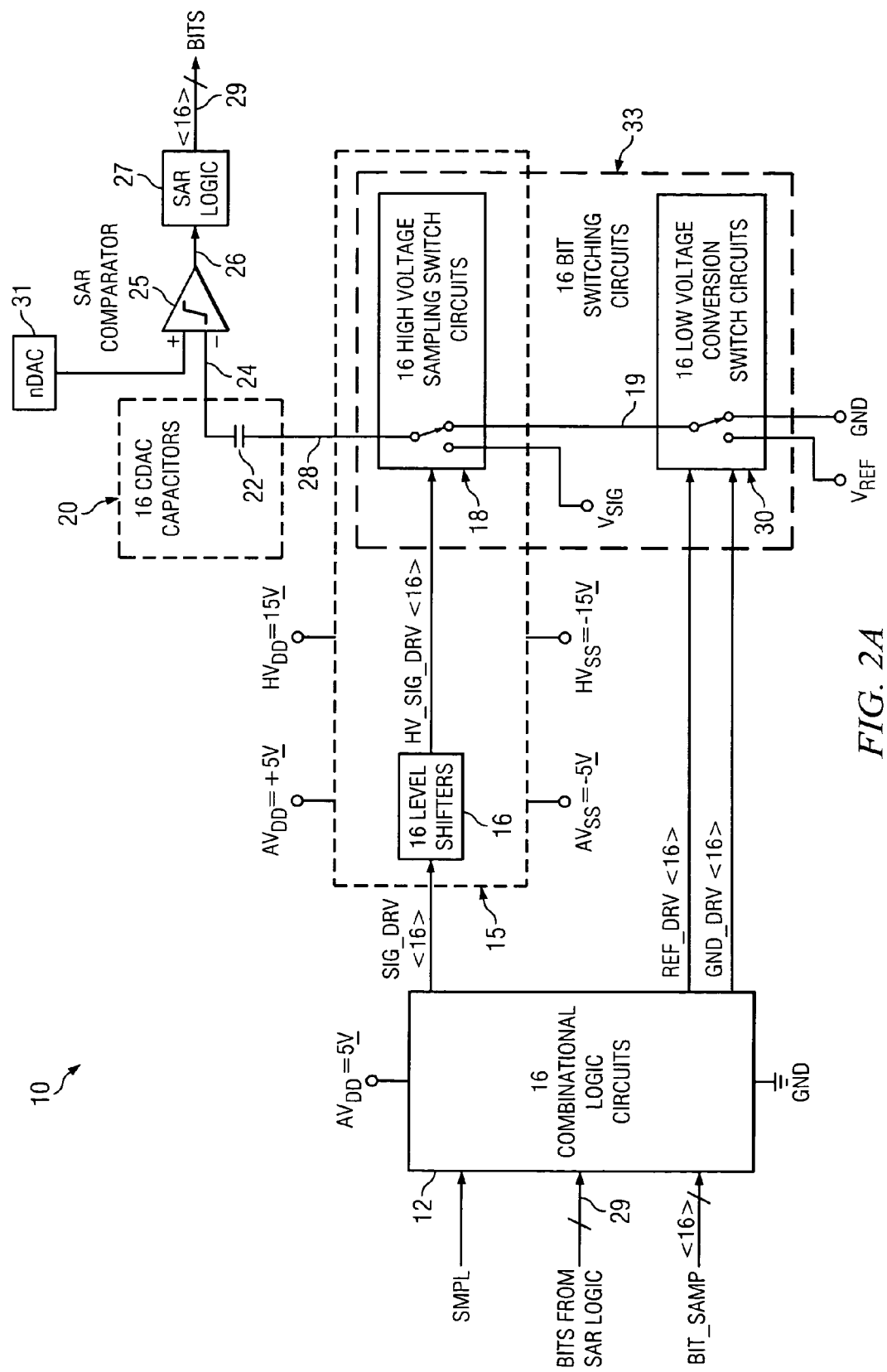
FIG. 2A is a generalized block diagram of a high-voltage SAR ADC of the present invention.

Referring now to FIG. 2A, to overcome the foregoing high dynamic power consumption problem of Prior Art FIG. 1A, a 16-bit high-voltage SAR ADC 10 is provided which includes 16 "low-voltage" (e.g., analog supply voltage $AV_{DD}$=5 volts) combinational logic circuits 12 that all receive an input sampling control signal SMPL from a digital control circuit (FIG. 2B), 16 bit data signals BIT generated by SAR logic 27 in response to the output of SAR comparator 25, and 16 "bit sampling" signals BIT_SAMP<1:16> that determine which of the 16 corresponding binarily weighted CDAC capacitors represented by capacitor 22 are utilized for sampling high-voltage analog input signal $V_{SIG}$. SAR logic 27 executes a well-known SAR algorithm for bit-by-bit testing of the output voltage of SAR comparator 25 to determine whether the present SAR ADC bit being generated should be a "1" or a "0".

Each of the 16 combinational logic circuits 12 generates corresponding low-voltage drive signals SIG_DRV, REF_DRV, and GND_DRV. Each of low-voltage drive signals SIG_DRV is applied to the input of a single corresponding one of 16 level shifter circuits 16 in block 15. Each level shifter circuit 16 generates a corresponding high-voltage sampling switch drive signal HV_SIG_DRV.

Bit switching circuitry 33 includes 16 bit switching circuits, one for each of the 16 bits of SAR ADC 10. Each of the 16 bit switching circuits in block 33 includes a high-voltage sampling switch circuit 18 (hereinafter referred to simply as "sampling switch" 18) represented by a high-voltage single pole, double throw switch having its pole terminal coupled by a corresponding conductor 28 to the bottom plate of a corresponding one of the 16 CDAC capacitors 22 in CDAC 20. The pole terminal of each of the 16 high-voltage sampling switches 18 is controlled by a corresponding high-voltage signal HV_SIG_DRV. Bit switching circuitry 33 also includes 16 low-voltage single pole, double throw conversion switch circuits 30 (hereinafter, "conversion switches" 30). Each of the 16 high-voltage sampling switches 18 has one terminal connected to a "high-voltage" analog input signal $V_{SIG}$ and another terminal connected by a corresponding intermediate conductor 19 to the pole terminal of a corresponding one of 16 low-voltage conversion switches 30. Each of the 16 low-voltage conversion switches 30 also has one terminal connected to $V_{REF}$ and another terminal connected to GND.

The pole terminal 28 of each of the 16 high-voltage sampling switches 18 is controlled so as to connect that pole terminal 28 to $V_{SIG}$ in response to a HIGH level of a corresponding high-voltage HV_SIG_DRV drive signal and to connect the pole terminal 28 of that sampling switch 18 to the corresponding intermediate conductor 19 in response to a LOW level of that corresponding high-voltage HV_SIG_DRV drive signal. The pole terminal of each of the 16 conversion switches 30 is controlled so as to connect intermediate conductor 19 to $V_{REF}$ in response to a HIGH level of a corresponding low-voltage REF_DRV drive signal. The pole terminal of each of the 16 low-voltage conversion switches 30 also is controlled so as to connect the corresponding intermediate conductor 19 to GND in response to a HIGH level of a corresponding low-voltage GND_DRV drive signal.

The upper plate of each of the 16 capacitors 22 of a "pDAC" in block 20 is connected by a single conductor 24 to the (−) input of SAR comparator 25, the output of which is connected to an input of SAR logic 27. SAR logic 27 sequentially generates a decision bit on every conversion clock (CLK) cycle and thereby generates the 16 above mentioned bit signals BIT<1:16> (FIG. 2B) in response to "sampled-$V_{SIG}$" voltage comparisons made by comparator 25. The (+) input of SAR comparator 25 is connected to a low-voltage implementation of a "nDAC" in block 31 that is essentially similar to the "pDAC" in block 20. The circuitry in block 15 is partly powered by "high" supply voltages $HV_{DD}$ and $HV_{SS}$, which may be 15 volts and −15 volts, respectively, and also is partly powered by "low" supply voltages $AV_{DD}$ and $AV_{SS}$, which may be 5 volts and zero (GND) volts, respectively.

Figure 2B:
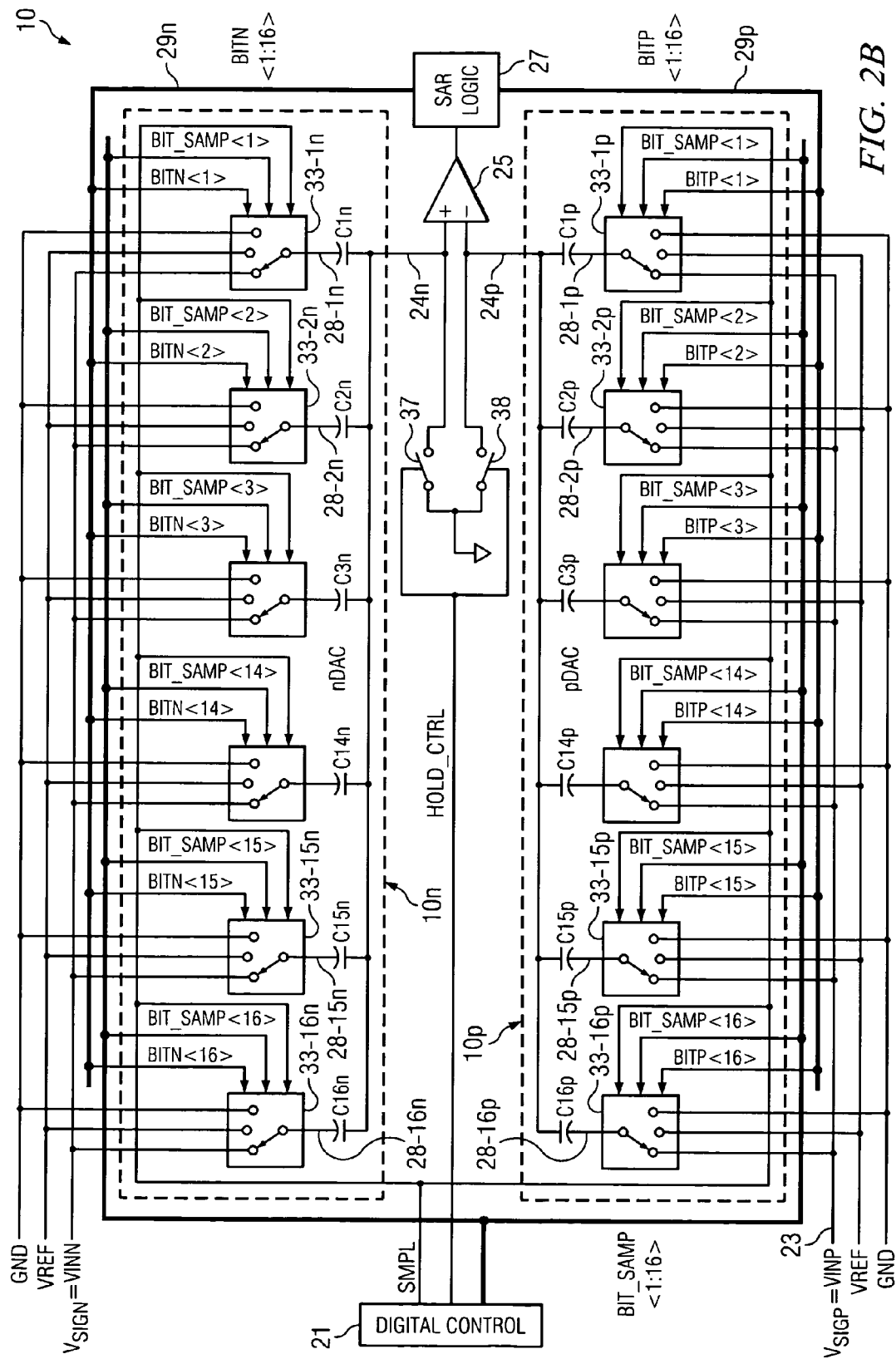
FIG. 2B is a more detailed diagram of the high-voltage SAR ADC of FIG. 2A.

FIG. 2B shows more details of 16-bit SAR ADC 10 in FIG. 2A. In FIG. 2B, a digital control circuit 21 generates sample/convert control signal SMPL and the 16 control signals BIT SAMP<1:16>. SAR ADC 10 also includes a first CDAC 10p (which is referred to as a "pDAC" because its output 24p is connected to the negative (−) input of SAR comparator 25 and the input signal $V_{SIG}$ is inverted on the top plate conductor 24p, so the final state of the capacitors in pDAC 10p is equal to the final digital output produced by SAR ADC 10). First CDAC 10p includes 16 binarily weighted CDAC capacitors C1p, C2p . . . C16p which correspond to the 16 CDAC capacitors 22 in FIG. 2A. Capacitors C1p, C2p . . . C16p each have an upper plate connected to conductor 24p. First CDAC 10p also includes 16 bit switching circuits 33-1p, 33-2p . . . 33-16p, which are collectively referred to as "bit switching circuitry 33". Bit switching circuitry 33 includes bit switching circuitry 33 of FIG. 2A and, for convenience of illustration, also includes level shifter circuits 16 and combinational logic 12 of FIG. 2A, as shown in FIG. 2C.

The lower plates of CDAC capacitors C1p, C2p . . . C16p in FIG. 2B are connected by 16 corresponding conductors 28-1p, 28-2p . . . 28-16p to corresponding pole terminals of the sampling switches 18 in the 16 bit switching circuits 33-1p, 33-2p . . . 33-16p, respectively. An implementation of each of bit switching circuits 33-1p, 33-2p . . . 33-16p is represented by bit switching circuit 33 shown in FIG. 2C.

Figure 2C:
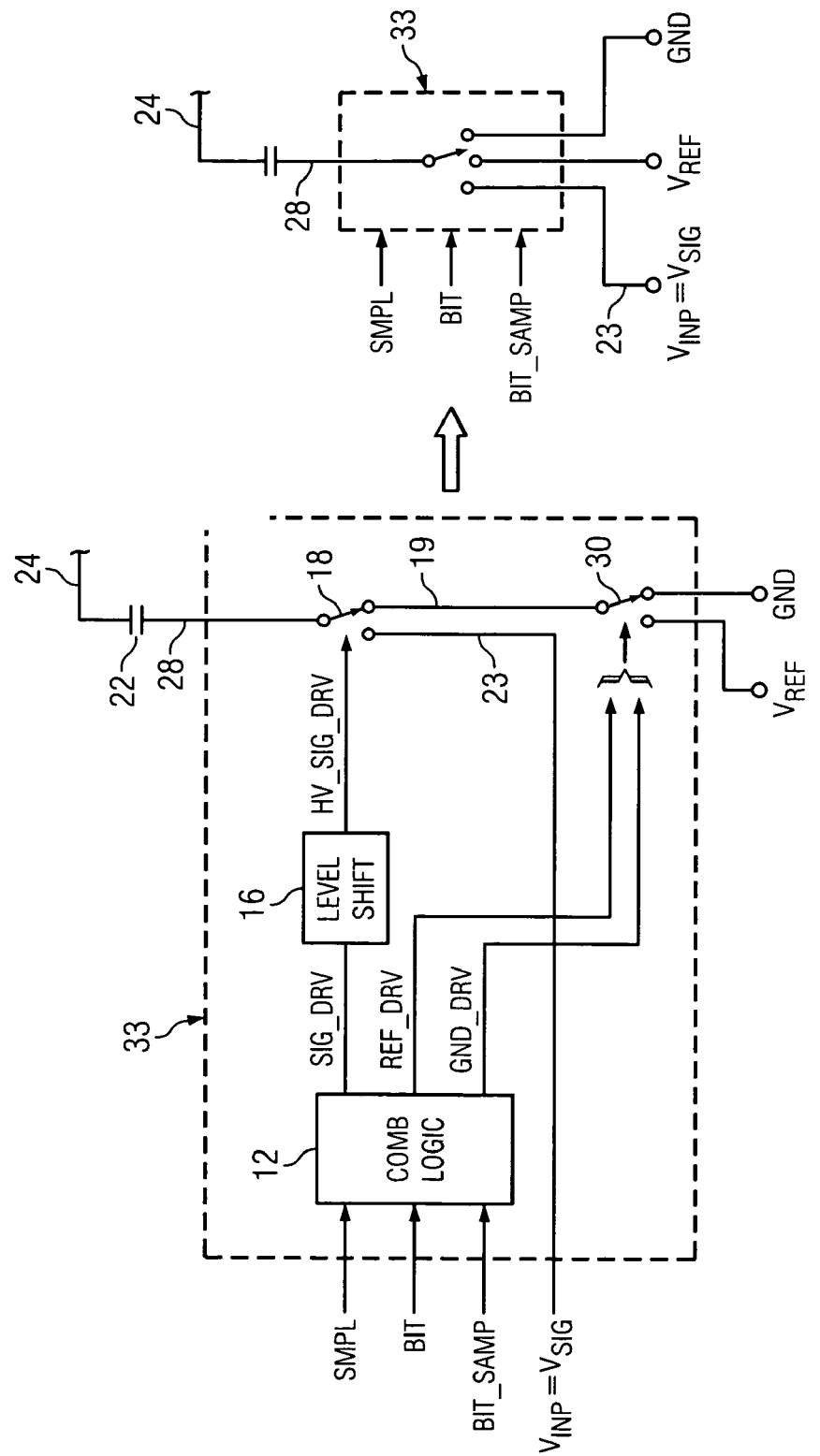
FIG. 2C is a schematic diagram of block 33 in FIG. 2A.

Referring now to FIG. 2C, each bit switching circuit 33 includes a low-voltage combinational logic circuit 12 which receives the sample/convert signal SMPL, one of the 16 signals BIT<1:16>, and one of the 16 signals BIT_SAMP<1: 16> indicated in FIG. 2B. (An implementation of combinational logic circuit 12 is shown in subsequently described FIG. 3.) Each low-voltage combinational logic circuit 12 generates a drive signal SIG_DRV which is applied to the input of a high-voltage level shifter circuit 16. (An implementation of level shifter circuit 16 is shown in subsequently described FIG. 4.) Each level shifter circuit 16 generates a high-voltage output signal HV_SIG_DRV that is applied to control the corresponding high-voltage sampling switch 18 having its pole terminal connected by the corresponding conductor 28 (i.e., the corresponding one of conductors 28-1p, 2p . . . 16p in FIG. 2B) to the lower plate of a corresponding CDAC capacitor 22 (i.e., a corresponding one of capacitors C1p, C2p . . . C16p in FIG. 2B).

During the sampling mode, the bottom plate of the corresponding CDAC capacitor 22 in FIG. 2C (i.e., the corresponding one of capacitors C1p, C2p . . . C16p in FIG. 2B) is connected to $V_{SIG}$ by the ON switch 18, and conversion switch 30 is turned OFF. Intermediate node 19 is connected to GND by turning ON the GND switch. Since intermediate node 19 is connected to GND, the $V_{REF}$ and GND transistors can be low-voltage transistors.

Each combinational logic circuit 12 also generates corresponding low-voltage drive signals REF_DRV and GND_DRV, which control a corresponding conversion switch 30 by selectively coupling its pole terminal to $V_{REF}$ in response to the corresponding signal REF_DRV and by selectively coupling the pole terminal of that conversion switch 30 to GND in response to GND_DRV. The pole terminal of the corresponding low-voltage conversion switch 30 is connected by the corresponding intermediate conductor 19 to one terminal of high-voltage sampling switch 18. The other terminal of sampling switch 18 is connected to receive the high-voltage analog input voltage $V_{SIG}$, which is equal to $V_{INP}$ if bit switching circuit 33 is included in pDAC 10p in FIG. 2B (and is equal to $V_{INN}$ if bit switching circuit 33 is included in nDAC 10n in FIG. 2B). An implementation of high-voltage sampling switch 18 is indicated in subsequently described FIGS. 5, 5A and 5B. (Of course, each of the illustrated single-pole, double throw switches shown in FIGS. 2B and 2C can be readily implemented by means of two single-pole, single throw switches having a common pole terminal.)

Depending on the resulting decision for a particular bit of SAR ADC 10, the $V_{REF}$ switching transistor or the GND switching transistor may be turned ON. Since the $V_{REF}$ and GND transistors are low-voltage transistors, the digital control signals REF_DRV and GND_DRV can be low-voltage signals, so no level shifter circuits are required to generate them.

Referring to both FIGS. 2B and 2C, the 16 sample/convert signals BIT_SAMP<1:16> are connected to the BIT_SAMP inputs of the combinational logic circuit 12 of each of bit-switching circuits 33-1p, 33-2p . . . 33-16p, respectively. The sample/convert signal SMPL is connected to the SMPL inputs of the combinational logic circuit 12 of each of bit-switching circuits 33-1p, 33-2p . . . 33-16p. The 16 signals BITP<1:16> produced by SAR logic circuit 27 are connected to the BIT inputs of the combinational logic circuit 12 of each of bit switching circuits 33-1p, 33-2p . . . 33-16p, respectively. The $V_{SIG}$, $V_{REF}$, and GND inputs of each of bit-switching circuits 33-1p, 33-2p . . . 33-16p in CDAC 10p are connected to $V_{INP}$, $V_{REF}$, and GND, respectively.

SAR ADC 10 includes a low-voltage second CDAC 10n (which is referred to as a "nDAC" because its output 24n is connected to the positive (+) input of SAR comparator 25. Second CDAC 10n includes 16 binarily weighted CDAC capacitors C1n, C2n . . . C16n each having an "upper" plate connected to conductor 24n. The "lower" plates of the 16 CDAC capacitors C1n, C2n . . . C16n are connected by 16 corresponding conductors 28-1n, 28-2n . . . 28-16n to corresponding pole terminals of sampling switches 18 in the 16 bit switching circuits 33-1n, 33-2n ... 33-16n, respectively. Bit switching circuits 33-1n, 33-2n ... 33-16n can be the same as bit switching circuits 33-1p, 33-2p ... 33-16p.

The 16 sample/convert signals BIT_SAMP<1:16> are connected to the BIT_SAMP inputs of the combinational logic circuit 12 of each of bit-switching circuits 33-1n, 33-2n ... 33-16n. Sampling signal SMPL is connected to the SMPL inputs of combinational logic circuit 12 of each of bit-switching circuits 33-1n, 33-2n ... 33-16n. The 16 signals BITN<1:16> signals produced by SAR logic circuit 27 are connected to the BIT inputs of the combinational logic circuits 12 of bit-switching circuits 33-1n, 33-2n ... 33-16n, respectively. The $V_{SIG}$, $V_{REF}$, and GND inputs of each of bit-switching circuits 33-1n, 33-2n ... 33-16n in CDAC 10n are connected to $V_{INN}$, $V_{REF}$, and GND, respectively.

Digital control circuit 21 also generates a sample/hold signal HOLD_CTRL which is applied to control two sample/hold switches 37 and 38. One terminal of each of sample/hold switches 37 and 38 is connected to GND. The other terminal of sample/hold switch 38 is connected by conductor 24p to the (−) input of comparator 25, and the other terminal of sample/hold switch 37 is connected by conductor 24n to the (+) input of comparator 25. The HOLD_CTRL signal is almost the same as the SMPL signal except for some digital timing differences. The signal HOLD_CTRL is HIGH during the sampling mode when switches 37 and 38 are turned ON. This connects the two "top plate" conductors 24p and 24n to GND, and the bottom plates 28-1p, 2p ... 16p and 28-1n, 2n ... 16n of the sampling capacitors to the appropriate high-voltage analog input signal $V_{SIG}$ ($V_{SIGP}$ or $V_{SIGN}$) during this time. That is, all of the CDAC capacitors of pDAC 10p are connected to $V_{SIGP}$, and all of the CDAC capacitors of nDAC 10n are connected to $V_{SIGN}$ (which is very close to GND). Consequently, a charge corresponding to the appropriate input voltage $V_{SIG}$ is stored in each CDAC. During the conversion mode, the HOLD_CTRL signal toggles and turns OFF switches 37 and 38 so that the top plate conductors can remain electrically floating during the conversion process.

Figure 3:
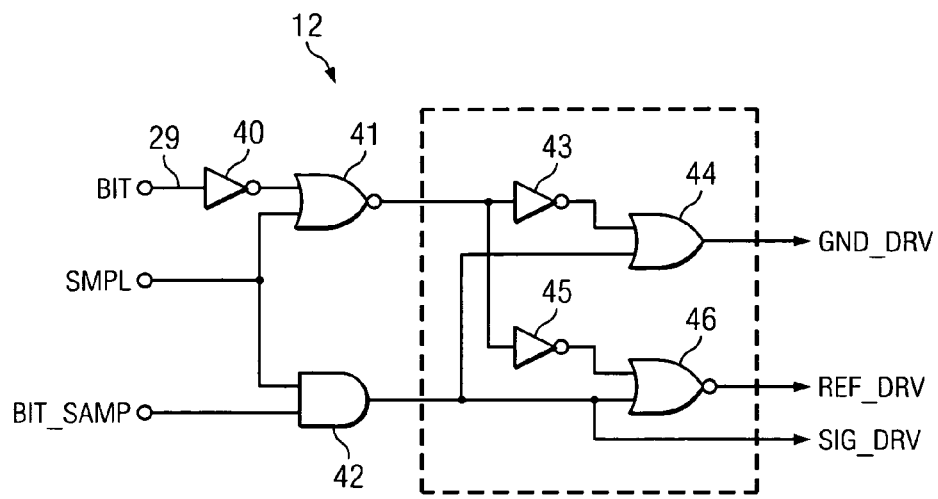
FIG. 3 is a logic diagram illustrating combinational logic circuitry in block 12 of FIG. 2.

FIG. 3 shows one implementation of combinational logic circuit 12 of FIG. 2C, wherein combinational logic circuit 12 includes an inverter 40 having its input coupled by conductor 29 to receive a corresponding one of bit signals BITP<1:16> generated by SAR logic 27. For the case in which combinational logic circuit 12 is included in pDAC 10p, conductor 29 is one of conductors 29p in FIG. 2B, and for the case in which combinational logic circuit 12 is included in nDAC 10n, conductor 29 is one of conductors 29n in FIG. 2B. The output of inverter 40 is connected to one input of NOR gate 41. The other input of NOR gate 41 is connected to receive sample/convert signal SMPL, which is also coupled to one input of two-input AND gate 42. The other input of AND gate 42 is coupled to receive a corresponding one of the 16 ADC gain control signals BIT_SAMP<1:16> produced by digital control circuit 21. (The gain of SAR ADC 10 depends on the number of CDAC capacitors being used for sampling analog input signal $V_{SIG}$.) The output of NOR gate 41 is connected to the inputs of inverters 43 and 45. The output of inverter 43 is connected to one input of OR gate 44. The output of AND gate 42 is connected to the other input of OR gate 44 and to one input of NOR gate 46. The other input of NOR gate 46 is connected to the output of inverter 45. AND gate 42 generates the low-voltage drive signal SIG_DRV. NOR gate 46 generates the low-voltage drive signal REF_DRV, and OR gate 44 generates the low-voltage drive signal GND_DRV.

By way of definition, the term "ORing gate" as used herein is intended to encompass either an OR gate or a NOR gate, and the term "ANDing gate" used herein is intended to encompass either an AND gate or a NAND gate.

Sample/convert signal SMPL indicates whether SAR ADC 10 is to be in its $V_{SIG}$ sampling mode or its analog-to-digital conversion mode. Specifically, SMPL is at a logic HIGH level when the SAR ADC 10 is in its $V_{SIG}$ sampling mode and is at a logic LOW level when SAR ADC 10 is in its conversion mode. SMPL goes to a HIGH level when one conversion operation ends, and remains HIGH until a falling edge of an earlier external user-provided "start conversion" signal CONVST (not shown) initiates another conversion. The 16 bit signals BITP<1:16> and the 16 bit signals BITN<1:16> generated by SAR logic 27 are the results of bit decisions sequentially made by SAR logic 27 in response to the output of SAR comparator 25 during the successive approximation procedure performed by SAR logic 27.

The 16 ADC gain control signals BIT_SAMP<1:16> received by the 16 bit switching circuits 33 from digital control circuit 21 determine, respectively, whether or not each particular CDAC bit capacitor is to be used for sampling analog input signal $V_{SIG}$. ADC gain control signal BIT_SAMP is at a logic HIGH level if the corresponding CDAC capacitor 22 (i.e., the corresponding one of CDAC capacitors Cp1, Cp2 ... Cp16 in FIG. 2B) is used to sample the analog input signal $V_{SIG}$, and is at a logic LOW level if the corresponding CDAC capacitor 22 is not being used to sample the analog input signal $V_{SIG}$. (This technique is disclosed in U.S. Pat. No. 6,922,165 entitled "Method and Circuit for Gain and/or Offset Correction in a Capacitor Digital-to-Analog Converter" issued Jul. 26, 2005 to present inventor Robert Seymour.)

The low-voltage drive signal SIG_DRV generated by each combinational logic circuit 12 drives the corresponding level shifter 16, which in turn drives the corresponding high-voltage sampling switch 18. High-voltage sampling switch 18 is turned ON in response to SIG_DRV being at a logic HIGH level. If the ADC gain control signal BIT_SAMP for a particular bit of SAR ADC 10 is at a LOW logic level, then the corresponding CDAC capacitor 22 is not used to sample the input signal $V_{SIG}$, so in that case SIG_DRV stays at a LOW level permanently. However, if that ADC gain control signal BIT_SAMP is at a HIGH level, then the corresponding signal SIG_DRV in effect "follows" sample/convert signal SMPL. The low-voltage drive signal REF_DRV generated by each combinational logic circuit 12 drives the corresponding low-voltage $V_{REF}$ switch, which is ON when REF_DRV is at a HIGH level. REF_DRV is always at a LOW level during a $V_{SIG}$ sampling operation.

During a conversion operation, REF_DRV goes HIGH if the corresponding signal BIT is HIGH, and vice-versa. The low-voltage drive signal GND_DRV generated by each combinational logic circuit 12 drives the low-voltage GND switch, which is turned ON when GND_DRV is at a HIGH level. During conversion operation, drive signal GND_DRV goes to a HIGH level when BIT is at a LOW level, and goes to a LOW level when BIT is at a HIGH level. Irrespective of whether the BIT_SAMP signal is HIGH or LOW, GND_DRV may be HIGH during sampling operation so as to connect intermediate conductor 19 to GND in order to protect the low-voltage transistors in conversion switch 30 from high voltages on intermediate conductor 19.

Figure 4:
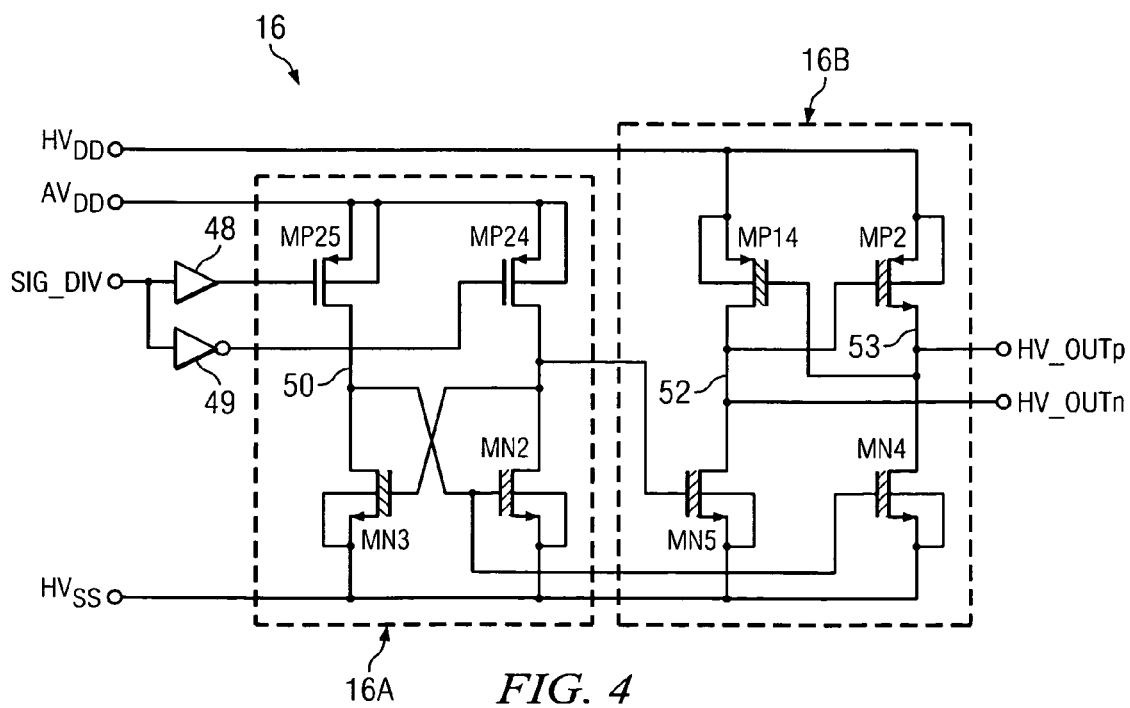
FIG. 4 is a schematic diagram illustrating high-voltage level shifter circuitry in block 16 and FIG. 2.

FIG. 4 shows one way each of the 16 level shifters 16 can be implemented. In FIG. 4, level shifter 16 includes a non-inverting buffer 48 and an inverter 49 each having its input connected to receive a corresponding low-voltage drive signal SIG_DRV. The output of buffer 48 is connected to the gate of a P-channel transistor MP25 having its source connected to the low-voltage supply $AV_{DD}$ and its drain connected by conductor 50 to the drain of an N-channel transistor MN3, the gate of an N-channel transistor MN2, and the gate of an N-channel transistor MN4. Each of transistors MN3, MN2, and MN4 has its source connected to the high-voltage supply $HV_{SS}$. The output of inverter 49 is connected to the gate of a P-channel transistor MP24 having its source connected to $AV_{DD}$ and its drain connected by conductor 51 to the gate of transistor MN3, the drain of transistor MN2 and the gate of an N-channel transistor MN5. The source of transistor MN5 is connected to $HV_{SS}$ and its drain is connected by conductor 52 to the drain of a P-channel transistor MP14 and to the gate of a P-channel transistor MP2. The sources of transistors MP14 and MP2 are connected to high-voltage supply $HV_{DD}$. The gate of transistor MP14 is connected by conductor 53 to the drain of transistor MN4 and the drain of transistor MP2.

Transistors MP25, MP24, MN3, and MN2 form a first latch 16A, and transistors MP14, MP2, MN5, and MN4 form a second latch 16B. A high-voltage output signal HV_OUTp=HV_SIG_DRV is produced on conductor 53 of the second latch, and a complementary high-voltage output signal HV_OUTn is produced on conductor 52 of the second latch. High-voltage output signal HV_OUTp is basically a level-shifted, high-voltage version of SIG_DRV in FIGS. 2A-C.

First latch circuit 16A operates to latch the logic LOW level of the low-voltage input signal SIG_DRV to $HV_{SS}$ volts and the second stage 16B operates to latch the logic HIGH level to $HV_{DD}$ volts. When SIG_DRV is at a HIGH level, i.e. $AV_{DD}$, then high-voltage output signal HV_OUTp=HV_SIG_DRV is at a "high-magnitude" HIGH level, i.e. $HV_{DD}$ volts and HV_OUTn is at a "high-magnitude" LOW level, i.e. $HV_{SS}$ volts. Similarly, when SIG_DRV is at a LOW level, i.e. $AV_{SS}$ volts, output signal HV_OUTp is at a LOW level (i.e. $HV_{SS}$ volts) and HV_OUTn is at a HIGH level (i.e. $HV_{DD}$ volts). More specifically, when SIG_DRV is at a HIGH level, the gate of transistor MP24 is pulled LOW, so the gate of transistor MN5 goes to a HIGH level, i.e. $AV_{DD}$ volts. This turns on transistor MN5, causing it to pull down its drain voltage to $HV_{SS}$. This makes HV_OUTn equal to $HV_{SS}$, i.e. a logic LOW level. Since, HV_OUTn is at a LOW level equal to $HV_{SS}$, transistor MP2 is turned ON, causing it to pull HV_OUTp=HV_SIG_DRV to a HIGH level, i.e. to $HV_{DD}$. The reverse happens when SIG_DRV is at LOW level.

Thus, the two outputs of level shifter 16 are complementary, out-of-phase high-voltage signals that swing between the upper high-voltage supply level $HV_{DD}$ and the lower high-voltage supply level $HV_{SS}$. In one implementation of sampling switch 18, both HV_OUTp and HV_OUTn are used to control the connections of the pole terminal of sampling switch 18 to both $V_{SIG}$ and intermediate conductor 19.

Figure 4A:
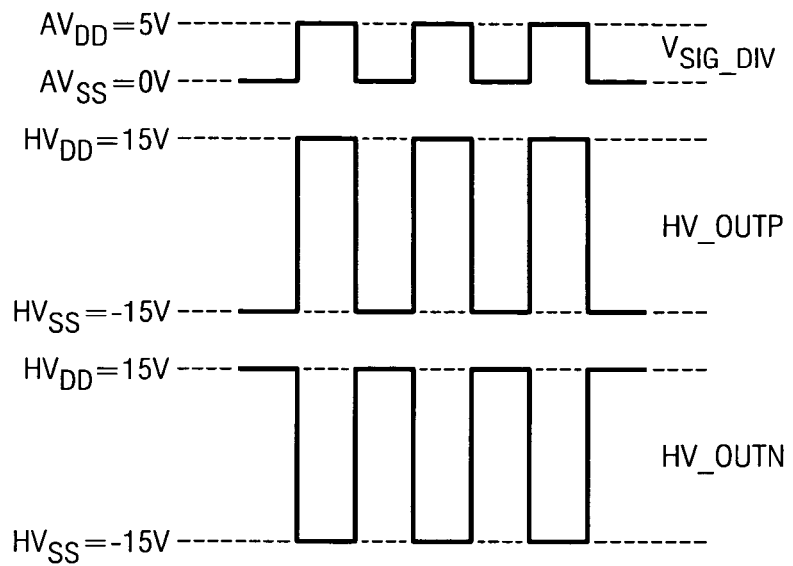
FIG. 4A is a timing diagram illustrating input and output signals for the level shifter circuitry shown in FIG. 4.

FIG. 4A shows example waveforms of SIG_DRV, HV_OUTp, and HV_OUTn.

Figure 5:
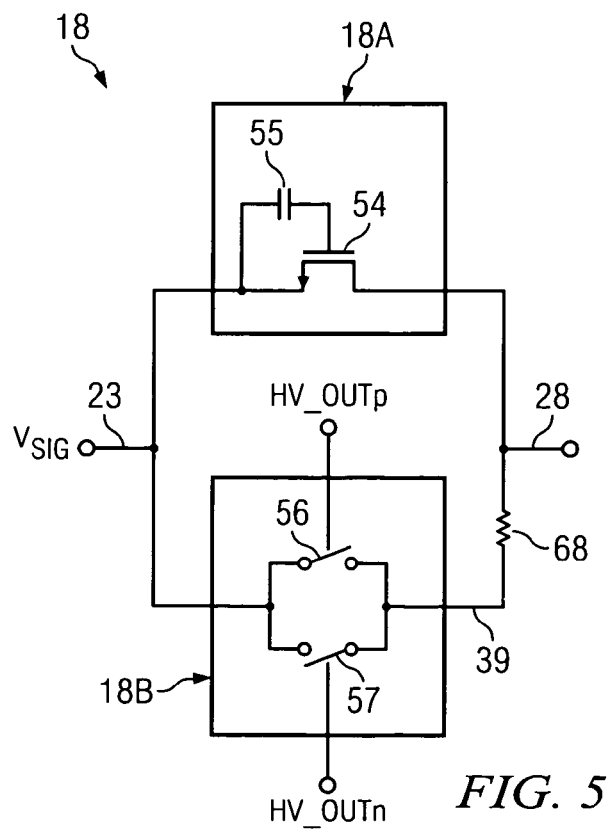
FIG. 5 is a simplified diagram of the input sampling switch circuit in block 18 in FIG. 2.

FIG. 5 shows a generalized implementation of a 16 bit sampling switch 18. A high-voltage, capacitively boosted N-channel transistor 18A is connected in parallel with a transmission gate 18B. Sampling switch 18 includes an N-channel transistor 54 having its source connected to conductor 23 so as to receive high-voltage analog input signal $V_{SIG}$. A boost capacitor 55 is coupled between the gate and source of transistor 54. Transmission gate 18B includes a first switch 56 and a second switch 57 coupled in parallel between conductor 23 and a conductor 39. Conductor 39 is connected to one terminal of a resistor 68 having its other terminal connected to conductor 28. Switch 56 may be an N-channel MOS transistor, the gate of which coupled to receive the signal HV_OUTp=HV_SIG_DRV shown in FIG. 4. Switch 57 may be a P-channel MOS transistor, the gate of which is coupled to receive the signal HV_OUTn (FIG. 4). Thus, sampling switch 18 includes two signal paths, one being through "gate-boosted" transistor 54, which provides the low impedance needed for a fast $V_{SIG}$ sampling rate. The other signal path is through transmission gate 18B.

Transmission gate 18B provides a continuous signal sampling path in case the sampling of $V_{SIG}$ requires so much time that the boost voltage across boost capacitor 55 decays to an unreasonable level. Resistor 55 increases the signal transit time through the path including transmission gate 18B. During the conversion process, boost capacitor 55 is precharged to a fixed voltage Vboost and transistor 54 is turned OFF by connecting its gate to $HV_{SS}$. During sampling, when N-channel transistor 54 needs to be turned ON, the high-voltage input signal $V_{SIG}$ is selectively coupled by transistor 66 and conductor 62 to the bottom plate of boost capacitor 55 and to the source of N-channel transistor 54, while the top plate of capacitor 55 is connected to the gate of N-channel transistor 54. In this way, transistor 54 is turned ON with an input-independent gate-source voltage equal to Vboost, thus providing a low switch impedance and reduced distortion from the input switching transistor 54.

Figure 5A:
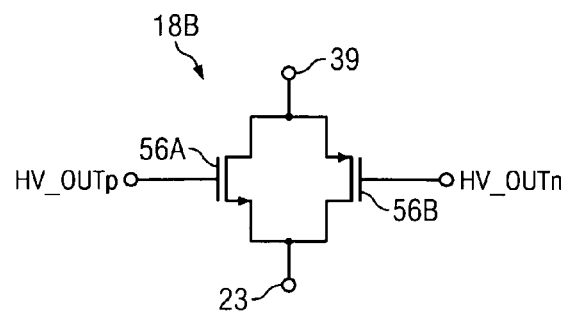
FIG. 5A is a schematic diagram of the transmission gate shown in FIG. 5.

Transmission gate 18B of FIG. 5 is shown in FIG. 5A, and includes a N-channel transistor 56A and a P-channel transistor 56B coupled in parallel between conductors 23 and 39. A resistor 68 is connected between conductor 39 and conductor 28.

Figure 5B:
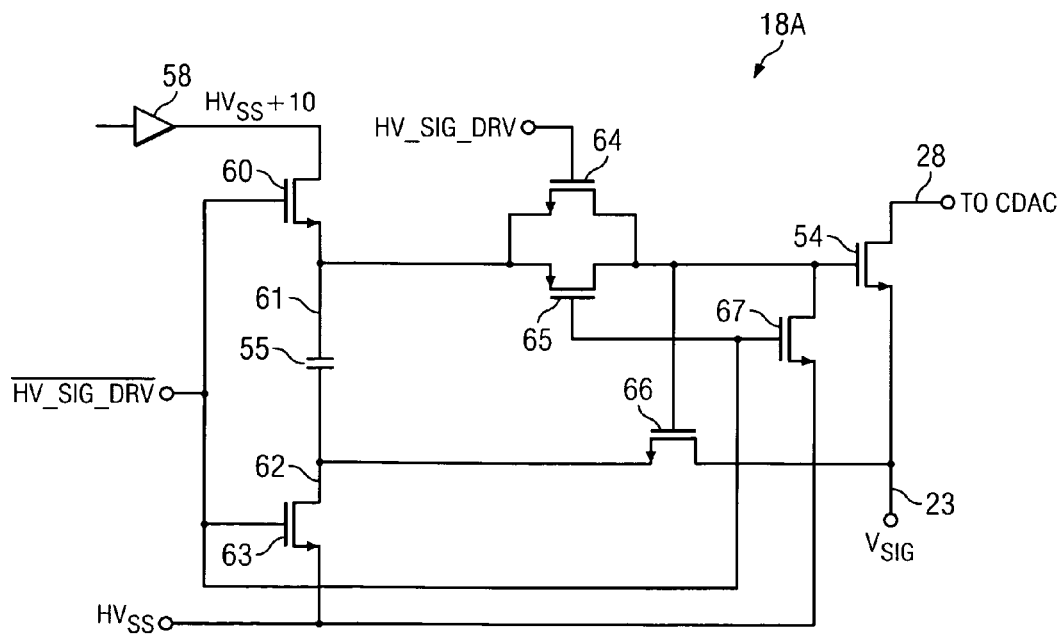
FIG. 5B is a schematic diagram of the gate-boosted NMOS switch circuit shown in FIG. 5.

A schematic diagram of one implementation of sampling switch 18A of FIG. 5 is shown in FIG. 5B, wherein the sampling switch 18A includes N-channel transistor 60 having its drain coupled by conductor 59 to the output of a buffer 58. Buffer 58 generates a precharging bias voltage on conductor 59 equal to $HV_{SS}$+Vboost=$HV_{SS}$+10 volts, which is used to pre-charge boost capacitor 55. The source of transistor 60 is coupled by conductor 61 to one plate of boost capacitor 55, the source of an N-channel transmission gate transistor 64, and the source of a P-channel transmission gate transistor 65. The drains of transistors 64 and 65 are connected to the gate of an N-channel transistor 66, the gate of N-channel transistor 54, and the drain of an N-channel transistor 67. The other plate of boost capacitor 55 is connected by conductor 62 to the drain of an N-channel transistor 63 and the source of transistor 66. The drain of transistor 66 is connected by conductor 23 to $V_{SIG}$ and the source of transistor 54. The drain of transistor 54 is connected to a corresponding CDAC capacitor by conductor 28. The sources of transistors 63 and 67 are connected to high-magnitude low-voltage supply $HV_{SS}$. The gates of transistors 60, 63, 65, and 67 are connected to the logical complement of HV_SIG_DRV, and the gate of transistor 64 is connected to HV_SIG_DRV.

During the conversion mode of SAR ADC 10, boost capacitor 54 is precharged by buffer 58. The signal HV_SIG_DRVn (which is the same as HV_OUTn in FIG. 4) is at a HIGH level, which turns ON transistors 60 and 63. This connects boost capacitor 55 between the output of buffer 58 and the $HV_{SS}$ supply voltage, so a precharge voltage of Vboost=10 volts is stored on boost capacitor 55. During the conversion mode, the transmission switch, including transistors 64 and 65, is turned OFF so that transistor 54 is completely disconnected from boost capacitor 55. The gate of transistor 54 is connected to $HV_{SS}$ by turning ON N-channel transistor switch 67. Note that gate of transistor 67 is also controlled by the logical complement of HV_SIG_DRV (which is this the same as HV_OUTp in FIG. 4), which is at a HIGH level during the conversion mode.

During the sampling mode, HV_SIG_DRVn goes to a LOW level and HV_SIG_DRV goes to a HIGH level. This turns OFF transistors 60, 63, and 67 and also turns on the transmission gate transistor 64 and 65 and transistor 66. Since transistor 66 is turned ON, the input signal $V_{SIG}$ is applied to the bottom plate of boost capacitor 55, thus boosting its top-plate voltage to $V_{SIG}+10$ volts. Also, since transmission gate transistors 64 and 65 are turned ON, this results in connecting the top plate of boost capacitor 55 to the gate of transistor 54. Consequently, the gate-source voltage of transistor 54 is an essentially constant value of 10 volts (to which boost capacitor 55 is precharged by buffer 58) that turns ON transistor 54 so that input signal $V_{SIG}$ is connected directly through the low channel resistance of transistor 54 and conductor 28 to the bottom plate of the corresponding CDAC capacitor 22 (FIG. 2C). Due to the high, essentially constant gate-source voltage of transistor 54, it provides low impedance to achieve fast signal settling. Furthermore, the ON impedance of transistor 54 does not vary significantly with input signal $V_{SIG}$. This results in minimal signal distortion by SAR ADC 10.

The described embodiment of the invention provides a significant reduction in the dynamic power consumption of a high-voltage SAR ADC, by eliminating 2 of the 3 level-shifters in each prior art bit switching circuit and thereby providing substantial reduction in power consumed from the high-voltage power supply. The described embodiment invention also reduces the amount of integrated circuit chip area required for the SAR ADC. This is also achieved because 2 of the 3 switches in each bit switching circuit are formed using low-voltage transistors instead of the substantially larger high-voltage transistors.

A main advantage of the invention is the much lower dynamic power consumption of the described SAR ADC compared to the prior art. Another advantage is that substantially lower integrated circuit chip area is required for each bit switching circuit 33 because of the elimination of two level shifters for each bit-switching circuit 33 and because low-voltage transistors can be used for the conversion switches 30. Another advantage is that the magnitudes of the current spikes in the high-voltage power supply have been significantly reduced. Another advantage is that new bit switching circuitry 33 allows the high-voltage analog input signal $V_{SIG}$ to be directly sampled through a very low, relatively constant impedance onto the CDAC capacitors 22, which results in minimal signal distortion and good SNR performance along with the features of low power consumption and low die area. Yet another advantage of the described high-voltage SAR ADC is that it provides reduced gain error in the ADC transfer function along with reduced dynamic power consumption, because of the capability of selecting any value of capacitance in the CDAC onto which the high-voltage input signal is sampled. Furthermore, the faster conversion times are achieved because the "switched $V_{REF}$" settling time and the "switched GND" signal settling times are reduced because of the lower channel resistances that are achieved in the low-voltage switch circuits 30, and this is achieved without increasing integrated circuit chip size.

It should be understood that intermediate node 19 can be selectively coupled (by the corresponding low-voltage switch 30) to $V_{REF}$ instead of GND (as previously described) during the sampling mode, and this will also protect intermediate node 19, and hence also protect low-voltage switch 30, from damage due to high voltages.

It should also be understood that the described high-voltage switch architecture may be usable in high-voltage, switched-capacitor, programable gain amplifiers (PGAs), and possibly also in other high-voltage, switched-capacitor amplifiers (although there are other known solutions for such applications that are not applicable to SAR converters).

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A high-voltage switched capacitor circuit comprising:
   a plurality of capacitors each having a first terminal; and
   a plurality of bit switching circuits each including:
      a high-voltage sampling switch circuit having a first terminal coupled to a second terminal of a corresponding capacitor and a second terminal coupled to receive a high-voltage analog input signal, and a third terminal coupled to an intermediate conductor; and
      a low-voltage conversion switch circuit including a first terminal coupled to the intermediate conductor, a second terminal coupled to receive a first reference voltage, and a third terminal coupled to receive a second reference voltage;
   a plurality of low-voltage combinational logic circuits for generating a plurality of low-voltage first signals, respectively, in response to a sampling level of a mode control signal, each low-voltage combinational logic circuit also generating low-voltage second and third signals according to a corresponding one of a plurality of bit signals, respectively, during a predetermined level of the mode control signal; and
   a plurality of level-shifting circuits each having an input coupled to receive a corresponding low-voltage first signal, each level-shifting circuit generating a corresponding high-voltage second signal to control coupling of the first terminal of a corresponding high-voltage sampling switch circuit to the high-voltage analog input signal during the sampling level and to the intermediate conductor during the pre-determined level.

2. The high-voltage switched capacitor circuit of claim 1 wherein the high-voltage switched capacitor circuit is a high-voltage SAR ADC (successive approximation register analog-to-digital converter), the capacitors are CDAC capacitors each having a first terminal coupled to a first input of a comparator, and the predetermined level is a conversion level, the high-voltage SAR ADC including a SAR logic circuit having an input coupled to an output of the comparator, for performing a successive approximation procedure in response to the output of the comparator to successively generate the corresponding bit signals to provide a digital representation of the high-voltage analog input signal.

3. The high-voltage switched capacitor circuit of claim 2 wherein each level-shifting circuit includes a low-voltage first latch circuit having an input coupled to a corresponding low-voltage first signal and also includes a high-voltage second latch circuit having an input coupled to an output of the low-voltage first latch circuit, the high-voltage second latch circuit producing the high-voltage second signal and a high-voltage third signal which is a logical complement of the high-voltage second signal, the high-voltage second and third output signals being coupled to control a corresponding high-voltage sampling switch circuit.

4. The high-voltage switched capacitor circuit of claim 2 wherein each high-voltage sampling switch circuit includes a high-voltage boosted switch circuit including a boost transistor and a boost capacitor coupled between a gate and a first electrode of the boost transistor, the first electrode of the boost transistor being coupled to the second terminal of that high-voltage sampling switch circuit to receive the high-voltage analog input signal, a second electrode of the boost transistor being coupled to the first terminal of that high-voltage sampling switch circuit.

5. The high-voltage switched capacitor circuit of claim 4 wherein each high-voltage sampling switch circuit also includes a high voltage transmission gate controlled by a corresponding level-shifting circuit coupled in parallel with the high-voltage boosted switch circuit in that high-voltage sampling switch circuit.

6. The high-voltage switched capacitor circuit of claim 4 including precharging circuitry for precharging the boost capacitor.

7. The high-voltage switched capacitor circuit of claim 2 including a digital controller for generating the mode control signal and a plurality of ADC gain control signals to determine which of the plurality of CDAC capacitors are to be utilized for sampling of the analog input signal, wherein the plurality of low-voltage combinational logic circuits generate the plurality of low-voltage first signals, respectively, according to predetermined levels of the ADC gain control signals.

8. The high-voltage switched capacitor circuit of claim 2 wherein the SAR ADC is a 16-bit SAR ADC, and wherein the plurality of CDAC capacitors includes 16 CDAC capacitors in a first CDAC, the first CDAC including 16 of the bit switching circuits, 16 of the low-voltage combinational logic circuits, and 16 of the level shifting circuits.

9. The high-voltage switched capacitor circuit of claim 8 also including a second CDAC that is essentially similar to the first CDAC, wherein the CDAC capacitors in the second CDAC each have a first terminal coupled to a second input of the comparator.

10. The high-voltage switched capacitor circuit of claim 7 wherein each low-voltage combinational logic circuit includes a first inverter having an input coupled to receive a corresponding bit signal and an output coupled to a first input of a first ORing circuit, a second inverter having an input coupled to an output of the first ORing circuit and an output coupled to a first input of a second ORing circuit, a third inverter having an input coupled to the output of the first ORing circuit and an output coupled to a first input of a third ORing circuit, an ANDing circuit having an output coupled to a second input of the second ORing circuit and to a second input of the third ORing circuit, the mode control signal signal being applied to a second input of the first ORing circuit and a first input of the ANDing circuit, a corresponding ADC gain control signal being coupled to a second input of the ANDing circuit, the low-voltage first, second, and third signals being produced at the output of the ANDing circuit, an output of the third ORing circuit, and an output of the second ORing circuit, respectively.

11. The high-voltage switched capacitor circuit of claim 7 including a hold switch coupled between the second reference voltage and the first input of the comparator, the hold switch being controlled in response to a hold signal signal generated by the digital controller.

12. The high-voltage switched capacitor circuit of claim 1 wherein each low-voltage combinational logic circuit operates to cause a corresponding low-voltage conversion switch circuit to couple a corresponding intermediate conductor to one of the second and third terminals of that corresponding low-voltage sampling switch circuit during the sampling level of the mode control signal to protect the low-voltage conversion switch circuit from high voltages on the corresponding intermediate conductor.

13. The high-voltage switched capacitor circuit of claim 6 wherein the precharging circuitry produces a boosted output voltage equal to a high-magnitude lower reference voltage level plus a boost voltage, wherein the boost transistor is an N-channel transistor, and wherein the high-voltage boosted switch circuit includes:
  a first N-channel transistor having a drain coupled to receive the boosted output voltage and a source coupled to both a first terminal of the boost capacitor and a first terminal of a CMOS (complementary metal oxide semiconductor) transmission gate;
  a second N-channel transistor having a source coupled to the high-magnitude lower voltage reference level and a drain coupled to a second terminal of the boost capacitor and to a source of a third N-channel transistor having a drain coupled to the high-voltage analog input signal and a gate coupled to a second terminal of the CMOS transmission gate and to a gate of the boost transistor
  a fourth N-channel transistor having a source coupled to the high-magnitude lower reference voltage level and a drain coupled to the gate of the boost transistors; and
  wherein a gate of the first N-channel transistor, a gate of the second N-channel transistor, a gate of the fourth N-channel transistor, and a first control terminal of the CMOS transmission gate are coupled to receive a logical complement of the high-voltage second signal, and wherein a second control terminal of the CMOS transmission gate is coupled to receive the high-voltage second signal.

14. The high-voltage switched capacitor circuit of claim 2 wherein the SAR ADC is a 16-bit SAR ADC.

15. A method for providing reduced power consumption in a high-voltage SAR ADC (successive approximation register analog-to-digital converter) which includes:
  a plurality of CDAC capacitors each having a first terminal coupled to a first input of a comparator;
  a plurality of bit switching circuits each including a high-voltage sampling switch circuit having a first terminal coupled to a second terminal of a corresponding CDAC capacitor and a second terminal coupled to receive a high-voltage analog input signal
  a plurality of low-voltage combinational logic circuits for generating a plurality of low-voltage first signals, respectively, in response to a sampling level of a mode control signal, each low-voltage combinational logic circuit also generating corresponding low-voltage second and third signals according to a corresponding bit signal during a conversion level of the mode control signal and
  a plurality of level-shifting circuits each having an input coupled to receive a corresponding low-voltage first signal, each level-shifting circuit generating a corresponding high-voltage first signal to control coupling of the first terminal of a corresponding high-voltage sampling switch circuit to the second terminal during the sampling level, the method comprising:
    providing a low-voltage conversion switch circuit and an intermediate conductor in each bit switching circuit, wherein a first terminal of the low-voltage conversion switch circuit is connected to the intermediate conductor;
    coupling the first terminal of one of the high-voltage sampling switch circuits to the second terminal of that high-voltage sampling circuit in response to the corresponding high voltage second signal during the sampling level; and coupling a third terminal of that high-voltage sampling switch circuit to the intermediate conductor in that bit switching circuit during the conversion level, and, during the conversion level, coupling a second terminal of that low-voltage conversion switch circuit to receive a first reference voltage in response to the corresponding low-voltage second signal if the corresponding bit signal is at a first level, and coupling a third terminal of that low-voltage conversion switch circuit to receive a second reference voltage in response to the corresponding low-voltage third signal if the corresponding bit signal is at a second level.

16. The method of claim 15 including operating a SAR logic circuit having an input coupled to an output of the comparator to perform a successive approximation procedure in response to the output of the comparator to successively generate the corresponding bit signals to provide a digital representation of the high-voltage analog input signal.

17. The method of claim 15 including operating each low-voltage combinational logic circuit to cause a corresponding low-voltage conversion switch circuit to couple a corresponding intermediate conductor to one of the second and third terminals of that corresponding low-voltage sampling switch circuit during the sampling level of the mode control signal to protect the low-voltage conversion switch circuit from high voltages on the corresponding intermediate conductor.

18. The method of claim 17 including operating each low-voltage combinational logic circuit to cause the corresponding low-voltage conversion switch circuit to couple the corresponding intermediate conductor to the third terminal of that corresponding low-voltage sampling switch circuit during the sampling level of the mode control signal.

19. The method of claim 15 including providing in each bit switching circuit a high-voltage boosted switch circuit including a boost transistor and a boost capacitor coupled between a gate and a first electrode of the boost transistor in each high-voltage sampling switch circuit, the first electrode of the boost transistor being coupled to the second terminal of that high-voltage sampling switch circuit to receive the high-voltage analog input signal, a second electrode of the boost transistor being coupled to the first terminal of that high-voltage sampling switch circuit, the method including precharging the boost capacitor to produce a low impedance of the boost transistor.

20. A high-voltage SAR ADC (successive approximation register analog-to-digital converter) comprising:

a plurality of CDAC capacitors each having a first terminal coupled to a first input of a comparator;

a plurality of bit switching circuits each including a high-voltage sampling switch circuit having a first terminal coupled to a second terminal of a corresponding CDAC capacitor and a second terminal coupled to receive a high-voltage analog input signal;

a plurality of low-voltage combinational logic circuits for generating a plurality of low-voltage first signals, respectively, in response to a sampling level of a mode control signal, each low-voltage combinational logic circuit also generating corresponding low-voltage second and third signals according to a corresponding bit signal during a conversion level of the mode control signal;

a plurality of level-shifting circuits each having an input coupled to receive a corresponding low-voltage first signal, each level-shifting circuit generating a corresponding high-voltage first signal to control coupling of the first terminal of a corresponding high-voltage sampling switch circuit to the second terminal during the sampling level;

a low-voltage conversion switch circuit and an intermediate conductor in each bit switching circuit, wherein a first terminal of the low-voltage conversion switch circuit is connected to the intermediate conductor;

means for coupling the first terminal of one of the high-voltage sampling switch circuits to the second terminal of that high-voltage sampling circuit in response to the corresponding high voltage second signal during the sampling level; and means for coupling a third terminal of that high-voltage sampling switch circuit to the intermediate conductor in that bit switching circuit during the conversion level, and, during the conversion level, coupling a second terminal of that low-voltage conversion switch circuit to receive a first reference voltage in response to the corresponding low-voltage second signal if the corresponding bit signal is at a first level, and coupling a third terminal of that low-voltage conversion switch circuit to receive a second reference voltage in response to the corresponding low-voltage third signal if the corresponding bit signal is at a second level.

* * * * *